United States Patent
Hwang et al.

(10) Patent No.: US 9,525,387 B2
(45) Date of Patent: Dec. 20, 2016

(54) AMPLIFIER DOCKING AUDIO SYSTEM FOR VEHICLE

(71) Applicant: Hyundai Motor Company, Seoul (KR)

(72) Inventors: Seung Hai Hwang, Hwaseong-si (KR); Ji Sun Go, Guri-si (KR); Young Kim, Hwaseong-si (KR)

(73) Assignee: Hyundai Motor Company, Seoul (KR)

(*) Notice: Subject to any disclaimer, the term of this patent is extended or adjusted under 35 U.S.C. 154(b) by 98 days.

(21) Appl. No.: 14/476,173

(22) Filed: Sep. 3, 2014

(65) Prior Publication Data
US 2015/0171801 A1    Jun. 18, 2015

(30) Foreign Application Priority Data

Dec. 18, 2013  (KR) .................. 10-2013-0158386

(51) Int. Cl.
*H04B 1/00*      (2006.01)
*H03F 3/181*     (2006.01)
*H04R 5/04*      (2006.01)
*H04B 1/08*      (2006.01)

(52) U.S. Cl.
CPC .............. *H03F 3/181* (2013.01); *H04R 5/04* (2013.01); *H04B 1/082* (2013.01); *H04R 2205/021* (2013.01); *H04R 2499/13* (2013.01)

(58) Field of Classification Search
None
See application file for complete search history.

(56) References Cited

U.S. PATENT DOCUMENTS

| | | | |
|---|---|---|---|
| 5,303,422 A * | 4/1994 | Tsukuda | H04B 1/082 381/77 |
| 7,795,969 B2 | 9/2010 | Esguevillas et al. | |
| 2015/0156928 A1* | 6/2015 | Snider | H04B 1/082 361/756 |

FOREIGN PATENT DOCUMENTS

| | | |
|---|---|---|
| JP | 2000-52884 A | 2/2000 |
| KR | 1999-009801 A | 5/1999 |
| KR | 10-2007-0068854 A | 7/2007 |
| KR | 10-0739786 B1 | 7/2007 |
| KR | 10-2012-0103045 A | 9/2012 |
| KR | 10-2013-0055970 A | 5/2013 |

* cited by examiner

*Primary Examiner* — Andrew L Sniezek
(74) *Attorney, Agent, or Firm* — McDermott Will & Emery LLP

(57) ABSTRACT

An amplifier docking audio system for a vehicle includes a docking space in an audio body, a docking connector disposed on a printed circuit board of the audio body, and an external amplifier coupled to the docking connector of the audio body in the docking space to be connected to the printed circuit board of the audio body. When the external amplifier docks with the docking connector to be connected to the printed circuit board of the audio body in the docking space, processing and outputting of audio signals are performed.

4 Claims, 2 Drawing Sheets

AMPLIFIER DOCKING AUDIO SYSTEM FOR VEHICLE

CROSS-REFERENCE TO RELATED APPLICATION

This application claims under 35 U.S.C. §119(a) the benefit of priority to Korean Patent Application No. 10-2013-0158386 filed on Dec. 18, 2013, the entire contents of which are incorporated herein by reference.

TECHNICAL FIELD

The present disclosure relates to an audio system for a vehicle. More particularly, the present disclosure relates to an amplifier docking audio system which can enable a reduction of an amplifier mounting space and a simplification of a mounting structure and can improve the installation and assembly convenience when an external amplifier is applied to a vehicle.

BACKGROUND

Recent advances in audio and multimedia technology are inducing an evolution in vehicles toward a more comfortable and convenient environment capable of providing drivers with infortainment, and further providing both the drivers and passengers with high-quality audio and multimedia content while staying in the vehicles. Audio systems in today's vehicles are equipped with a driver information system, a navigation system, and a telematics system, which offer a variety of information as demanded by the drivers or the multimedia contents and sound.

In providing the sound and multimedia contents to the drivers and passengers, the use of amplifiers for amplifying audio signal and a speaker for outputting audio is essential. In an audio system (or audio, video & navigation (AVN) system), the main components for replaying the sound include a head unit embedded with a central processing unit (CPU) and a digital signal processor (DSP), an amplifier, and speakers installed around the vehicles. Here, under the control of the CPU, the DSP performs processing on audio signals inputted through an input terminal, and the amplifier amplifies the audios signals processed by the DSP to output the audio signals to each speaker.

Recently, various endeavors and studies are being conducted to achieve high quality sound output of the audio system. High-quality audio systems include external amplifiers to support a multi-channel, and thus to provide more refined and dynamic sound. The external amplifiers installed separately from the head unit are provided in luxurious vehicles for high quality sound. Recently, vehicle manufacturers receive high-quality external amplifiers supplied directly from external well-known brand amplifier makers and assemble them on the vehicles. The external amplifiers provided in the vehicles are based on a subwoofer 2-channel, a door speaker 4-channel, and an 8-channel output like midrange 2-channel, and can extend its channel capacity to a multi-channel such as 8-channel, 10-channel, and 12-channel.

However, for the installation of an external amplifier in a vehicle, a mounting space larger than the size of the amplifier has to be secured in the vehicle, a layout also has to be made with its installation structure, feasibility of installation, facility in assembling, stability, customer service, design all put into account, and the conditions between the amplifier and the head unit need to be strictly considered.

Even though space is secured for its installation, mounting brackets need to be designed according to the specifications of external brand amplifiers, and there follows a cost rise for development and molding according to the manufacture of mounted brackets. Also, there is a great deal of difficulty in installing the external amplifiers, and the man-hour, labor cost, and after-sales service (A/S) cost need to be considered. In addition, there is a limitation due to the surrounding vehicle parts.

Particularly, mutual influences with external electronic parts need to be considered when the head unit and the external amplifier are connected to each other through a wire. When the amplifier is mounted, designing is needed in consideration of the quality issues such as connection of a connector and its coupling force. For example, in vehicles with seats motor-operated in height and location, external amplifiers of which are installed under the seat, have a limitation in that the amplifiers and their auxiliary parts (such as wire) are interfered by other surrounding vehicle parts when the seats are moved (e.g. the amplifier becomes obstructed by the surrounding parts or its wiring becomes tangled).

The above information disclosed in this Background section is only for enhancement of understanding of the background of the disclosure, and therefore, it may contain information that does not form the prior art that is already known in this country to a person of ordinary skill in the art.

SUMMARY OF THE DISCLOSURE

The present disclosure provides an amplifier docking audio system for a vehicle, which enables reduction in amplifier mounting space and simplification of mounting structure and can improve installation and assembly convenience when an external amplifier is applied to the vehicle.

The present disclosure also provides an audio system for a vehicle, which can overcome cost rise due to a bracket for mounting an external amplifier, can reduce time and the labor cost for an amplifier assembly and A/S cost, can overcome interference and mutual influence between adjacent parts due to the installation of the amplifier, and can improve the quality of connector coupling.

According to an exemplary embodiment, an amplifier docking audio system for a vehicle includes a docking space prepared in an audio body. A docking connector is disposed on a printed circuit board of the audio body. An external amplifier is coupled to the docking connector of the audio body in the docking space to be connected to the printed circuit board of the audio body. When the external amplifier docks with the docking connector to be connected to the printed circuit board of the audio body in the docking space, processing and outputting of audio signals are performed.

The external amplifier may include a full digital type amplifier.

The audio body may include an embedded amplifier that amplifies and outputs the audio signals.

The embedded amplifier may include a full digital type amplifier.

The audio body may further include a docking sensor for sensing whether or not the external amplifier is docked. A switching device (S/D) for switching a circuit is connected to audio signal input terminals of each amplifier such that the audio signals are delivered and outputted to/from only the embedded amplifier or delivered and outputted to/from both the embedded amplifier and the external amplifier. A switching controller outputting a control signal for controlling switching driving of the S/D according to a docking result of the external amplifier is sensed by the docking sensor.

Other aspects and exemplary embodiments of the disclosure are discussed infra.

BRIEF DESCRIPTION OF THE DRAWINGS

The above and other features of the present disclosure will now be described in detail with reference to certain exemplary embodiments thereof illustrated by the accompanying drawings which are given hereinbelow by way of illustration only, and thus are not limitative of the present disclosure.

Figure 1:
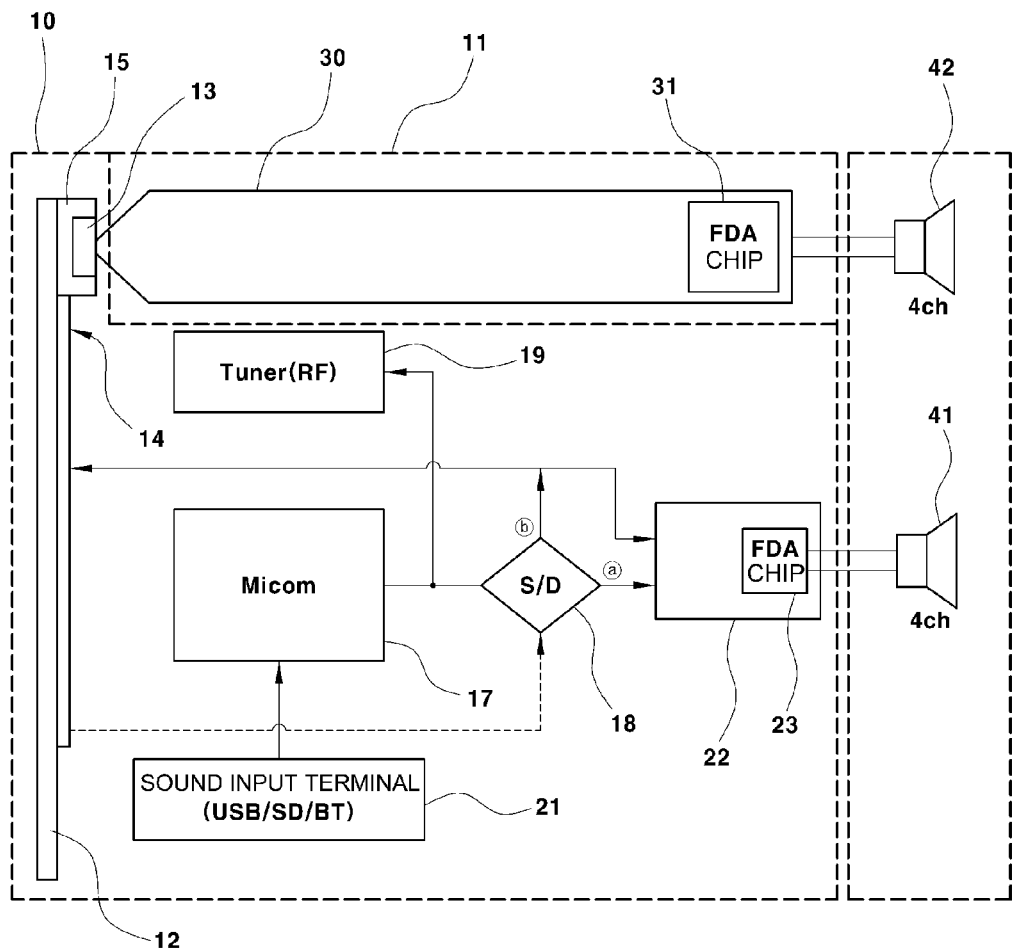
FIG. 1 is a view illustrating a docking-type audio system according to an embodiment of the present disclosure.

It should be understood that the accompanying drawings are not necessarily to scale, presenting a somewhat simplified representation of various exemplary features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

Hereinafter reference will now be made in detail to various embodiments of the present disclosure, examples of which are illustrated in the accompanying drawings and described below. While the disclosure will be described in conjunction with exemplary embodiments, it will be understood that present description is not intended to limit the disclosure to those exemplary embodiments. On the contrary, the disclosure is intended to cover not only the exemplary embodiments, but also various alternatives, modifications, equivalents and other embodiments, which may be included within the spirit and scope of the disclosure as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The above and other features of the disclosure are discussed infra.

Hereinafter, exemplary embodiments of the present disclosure will be described in detail with reference to the accompanying drawings so that those skilled in the art can easily carry out the present disclosure.

The present disclosure provides an amplifier docking audio system for a vehicle, which can enable a reduction of an amplifier mounting space and simplification of a mounting structure and can improve the installation and assembly convenience when an external amplifier is applied to a vehicle.

Also, the present disclosure provides an audio system for a vehicle, which can overcome an cost rise due to a bracket for mounting an external amplifier, can reduce the man-hour and the labor cost for an amplifier assembly and A/S cost, can overcome an interference and a mutual influence between adjacent parts due to the installation of the amplifier, and can improve the quality of connector coupling.

For this, an audio system for a vehicle according to an embodiment of the present disclosure is characterized in that a full digital amplifier that can be reduced in its volume is used and the full digital amplifier is integrally docked with an audio body. When the full digital amplifier is used as an external amplifier, heating of the amplifier can be overcome, and the volume of the amplifier can be reduced, and furthermore, it is possible to implement an integral audio body in which the external amplifier is docked into a head unit.

In applying high-quality external amplifiers of foreign famous brands to provide in-vehicle luxurious sound, when a vehicle manufacturer receives and installs full digital type external amplifiers that can be inserted into and docked with the audio body of a vehicle from a corresponding amplifier manufacturer, extension of the sound quality range of the external brands may be enabled, and limitations in mounting brackets, man-hour, interference with surrounding parts, and design can be simultaneously overcome.

Regarding the audio amplifier, the amplifier for amplifying audio signals may be classified into Class-A, Class-B, Class-AB, and Class-D according to the operation of a driving circuit. Unlike an analog amplifier to which Class-A, Class-B, or Class-AB is applied, a digital amplifier may adopt a Class-D driving circuit of a pulse-width modulation (PWM) amplification type.

The digital amplifier may modulate a digital signal such as a pulse code modulation (PCM) signal into a PWM signal through pulse-width modulation, and may amplify the amplitude of the PWM signal using a semiconductor switch element such as a field effect transistor (FET) and then extract an audio signal from the amplified PWM signal using a low pass filter. The full digital amplifier of the digital amplifiers that amplify audio signals by the PWM pulse type may directly receive a digital type of audio data to perform digital amplifier processing by digital signal processing and finally generate a PWM digital output.

Since the full digital amplifier has little limitation in heating compared to an analog type of typical amplifiers such as Class-AB, which amplifies analog signals, and may not need a bulky heat sink, the volume of the amplifier can be reduced. Also, compared to a typical Class-D type that converts into an analog through digital-analog converter (DAC) and then again converts into the PWM signal upon conversion from PCM to PWM, since a digital PCM signal is converted into a PWM signal without the DAC, gain and loss in the DAC process can be reduced.

Figure 2:
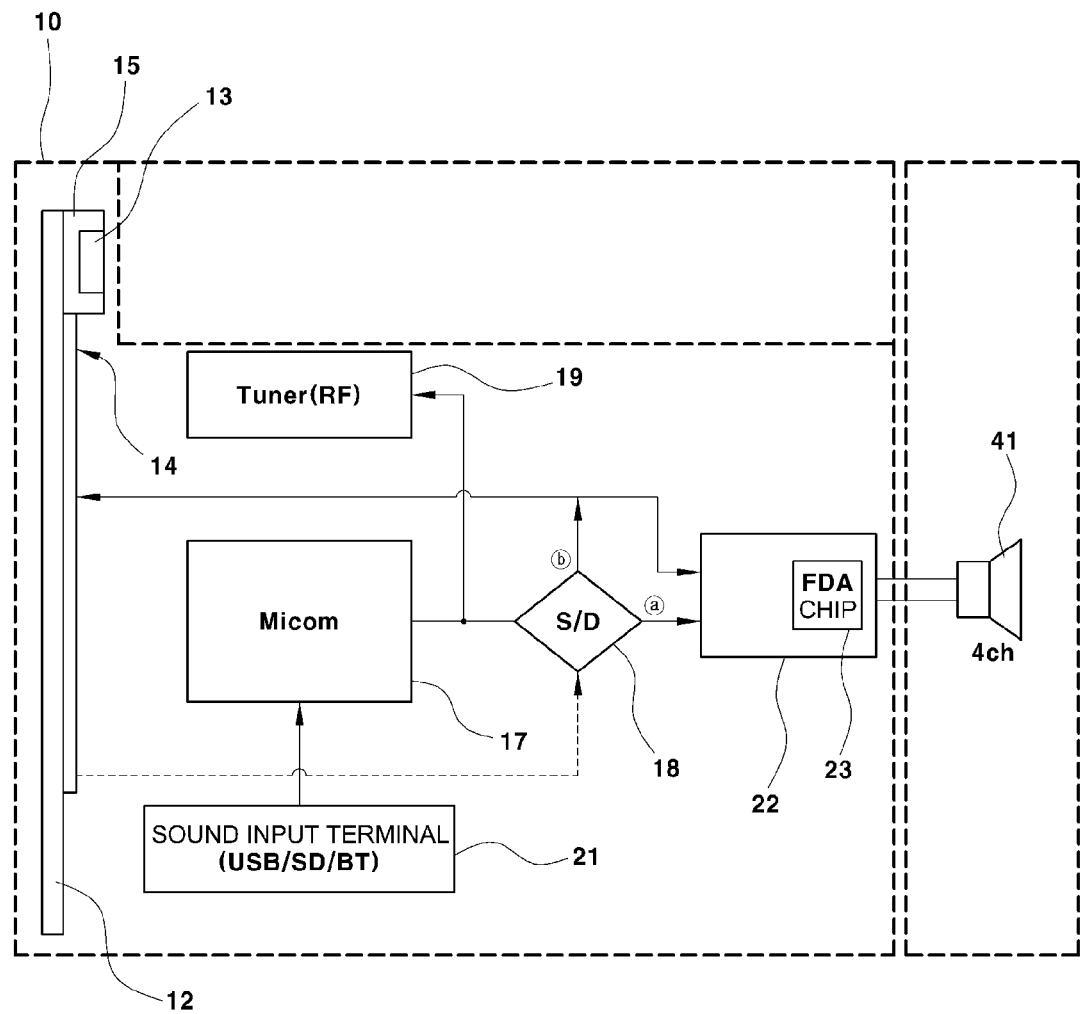
FIG. 2 is a view illustrating a pre-docking state of an external amplifier in a docking-type audio system according to an embodiment of the present disclosure.

FIG. 1 is a view illustrating a docking-type audio system according to an embodiment of the present disclosure, and FIG. 2 is a view illustrating a pre-docking state of an external amplifier in a docking-type audio system according to an embodiment of the present disclosure.

Reference numerals 41 and 42 denote a speaker that outputs audio. In a typical audio system, an external amplifier is mounted in a separate large installation space (under the seat) of a vehicle. However, in this embodiment, a full digital type of external amplifier 30 may be inserted into an audio body 10 to be combined with each other in a docking manner. For this, the audio body 10 may have a space 11 in which the full digital amplifier 30 docks with the audio body 10.

Here, a part with which the full digital amplifier 30 docks may be disposed in the inside of the audio 10 equipped with a printed circuit board 12, which may become a head unit in a typical audio system (or AVN system) for a vehicle. The docking space 11 may be prepared in an internal space of the head unit such that the amplifier 30 can be inserted into and docked in the docking space 11. Although not shown, in the docking space 11 of the head unit 10 in which the full digital amplifier 30 is inserted and coupled, a support plate with a simple structure may be disposed to support the full digital amplifier 30 in the docking space 11 of the head unit 10.

In addition, a guide member such as a slot or a rail may also be provided to guide the insertion and the sliding movement of the amplifier 30 while supporting the amplifier 30 in the docking space 11 so as to facilitate the insertion and the docking of the amplifier 30. Accordingly, when the full digital amplifier 30 is inserted into the docking space 11 of the head unit 10 and then slides and docks with the printed circuit board 12, the amplifier 30 may be connected to the printed circuit board 12 through a docking connector 13 described later, enabling the processing and output of audio signals.

In FIGS. 1 and 2, although a Micom 17, a switching device (S/D) 18, and a tuner 19 that output audio signals are shown separately from the printed circuit board 12, these audio-related devices and circuit parts such as the Micom 17, the S/D 18, and the tuner 19 may be mounted onto the printed circuit board 12 which the amplifier 30 docks with. The devices and circuit parts such as the Micom 17, the S/D 18, and the tuner 19 may be mounted onto a separate printed circuit board connected to the printed circuit board 12.

Also, the printed circuit board 12 may be mounted with the docking connector 13 that is a part docked and connected with the external amplifier 30 and a docking circuit 14 including a circuit configuration connected to the docking connector 13 and connecting the external amplifier (full digital amplifier) 30 docking with the docking connector 13 to the S/D 18 and a power supplier (not shown) to drive the external amplifier 30. In this case, the docking circuit 14 may include a docking sensor 15 that senses whether or not the external amplifier 30 docks with and a switching controller (not shown) that outputs switching signals for driving the S/D 18 according to the docking result of the external amplifier 30 that is sensed by the docking sensor 15.

While the docking connector 13 and the docking circuit 14 are mounted onto the printed circuit board 12 with which the external amplifier 30 docks, some or all other devices and circuit parts except the docking connector 13 and the docking circuit 14 may be mounted onto a separate printed circuit board connected to the printed circuit board 12.

A sound input terminal 21 may be provided in the audio body (head unit) 10 to receive sound data and deliver the sound data to the Micom 17. The sound input terminal 21 may be connected to a Bluetooth (BT) module or an input interface such as a universal serial bus (USB) and a Secure Digital (SD) slot to receive sound data. Also, an embedded amplifier 22 of a fixed type may be provided in the audio body 10 as a separate audio amplifier to amplify and output audio signals. The embedded amplifier 22 may become a 4-channel output amplifier, which can also become a full digital amplifier.

Accordingly, the audio system according to the embodiment may achieve a selective extension use of the amplifier by using the embedded amplifier 22 as a basic amplifier. As shown in FIG. 2, when the external amplifier 30 is not docked, 4-channel output may be performed only by the embedded amplifier 22. Also, the channel extension may be achieved by using the external amplifier 30 according to a desired number of channels while based on 4-channel of the embedded amplifier 22. The output of multi-channel may be achieved from 8-channel according to the number (4-channel or more) of channels of the external amplifier 30.

Thus, in the audio system according to the embodiment, the number of channels may start from four of the embedded amplifier 22, and when the external amplifier 30 is additionally docked, the number of channels may be extended according to the number of channels of the external amplifier 30. In the related art, since the audio system is based on an 8-channel external amplifier, the channel extension is limited to 8-channel or more, and thus, only an 8-channel external amplifier is used upon 8-channel operation.

On the other hand, in the audio system according to an exemplary embodiment, the channel extension may be possible from a 4-channel operation by using only the embedded amplifier 22 according to vehicles. When the 4-channel docking type external amplifier 30 is additionally used according to a necessity, an 8-channel system may be configured.

As described above, the docking type external amplifier 30 may be a full digital amplifier. The docking type external amplifier 30 may include the docking circuit unit connected when docking with the docking connector 13 of the printed circuit board 12, and may be embedded with a filter design analysis (FDA) chip 31 for the digital signal processing and signal amplification. The FDA chip 31 may be provided so as to process a sound digital signal processing (DSP) algorithm of a corresponding brand. Although not shown, the FDA chip 31 may be embedded with a Digital Signal Processor (DSP) for processing audio signals (digital signals) inputted from the Micom 17 to the amplifier 30, and a full digital swing unit that performs a full digital Class-D amplification of signals processed by the DSP.

The docking type external amplifier 30 may be assembled by a vehicle manufacturer that receives the external amplifier 30 from an external amplifier manufacturer and inserts and docks the external amplifier 30 into/with the head unit 10. The vehicle manufacturer may order an external amplifier dockable with the head unit 10 from a corresponding amplifier manufacturer and then may receive and assemble the external amplifier. Accordingly, a vehicle manufacture may flexibly apply each brand external amplifier, and may apply famous brand external amplifiers to promote high quality in-vehicle sound and satisfy consumers with high-quality brands.

In the audio system according to an exemplary embodiment, when the external amplifier 30 docks with the docking connector 13 of the printed circuit board 12 in the head unit 10, the docking sensor 15 of the docking circuit 14 mounted onto the printed circuit board 12 may sense the docking and connection of the external amplifier 30 to output signals. The switching controller may receive the docking sensing signals outputted from the docking sensor 15 to output control signals for switching the S/D 18.

As shown in FIGS. 1 and 2, the S/D 18 may be disposed on a connection circuit between the output terminal of the Micom 17 and the audio signal input terminal of the amplifiers 22 and 30 to switch the connection circuit such that audio signals outputted from the Micom 17 can be delivered to only the embedded amplifier 22 or both of the embedded amplifier 22 and the external amplifier 30 according to the control signals outputted from the switching controller. As shown in FIG. 2, in the audio system that does not docks with an external amplifier, the S/D 18 may deliver audio signals in the direction a to enable a 4-channel output using the embedded full digital amplifier 22.

On the other hand, as shown in FIG. 1, when the external amplifier 30 is docked, the docking sensor 15 may sense the docking of the external amplifier 30, and may output a docking sensing signal. Thus, the switching controller may control the driving of the S/D 18 to allow the S/D 18 to deliver audio signals in the direction b, and thus enable an 8-channel output using the embedded amplifier 22 and the external amplifier 30. Thus, in the audio system according to an exemplary embodiment, it may be automatically recognized whether or not the external amplifier is docked, achieving a 4-channel or 8-channel sound output.

According to an embodiment, in the amplifier docking audio system for a vehicle, a docking structure for an external amplifier is provided such that the external amplifier can be selectively used, and the external amplifier can be assembled by a docking method. Accordingly, a separate mounting space and structure for installing the external amplifier in a vehicle is not necessary, and an assembling work thereof can be omitted. Particularly, the amplifier docking audio system for a vehicle can enable reduction of an amplifier mounting space and simplification of a mounting structure and can improve installation and assembly convenience when an external amplifier is applied to a vehicle. Also, since a bracket with a complicated structure can be omitted, the cost and weight can be reduced.

Also, the present disclosure provides an audio system for a vehicle, which can overcome an cost rise due to a bracket for mounting an external amplifier, can reduce labor time and the labor cost for an amplifier assembly and A/S cost, can overcome an interference and a mutual influence between adjacent parts due to the installation of the amplifier, and can improve the quality of connector coupling.

The disclosure has been described in detail with reference to exemplary embodiments thereof. However, it will be appreciated by those skilled in the art that changes may be made in these embodiments without departing from the principles and spirit of the disclosure, the scope of which is defined in the appended claims and their equivalents.

What is claimed is:

1. An amplifier docking audio system for a vehicle, comprising:
    a docking space in an audio body;
    a docking connector disposed on a printed circuit board of the audio body; and
    an external amplifier coupled to the docking connector of the audio body in the docking space to be connected to the printed circuit board of the audio body,
    wherein when the external amplifier docks with the docking connector to be connected to the printed circuit board of the audio body in the docking space, processing and outputting of audio signals are performed, and
    wherein the audio body further comprises: an embedded amplifier that amplifies and outputs the audio signals; a docking sensor configured to sense whether or not the external amplifier is docked; a switching device (S/D) configured to switch a circuit connected to audio signal input terminals of each amplifier such that the audio signals are delivered and outputted to or from only the embedded amplifier or delivered and outputted to or from both the embedded amplifier and the external amplifier; and a switching controller configure to output a control signal for controlling switching driving of the S/D according to a docking result of the external amplifier sensed by the docking sensor.

2. The amplifier docking audio system of claim 1, wherein the external amplifier comprises a full digital type amplifier.

3. The amplifier docking audio system of claim 1, wherein the embedded amplifier comprises a full digital type amplifier.

4. The amplifier docking audio system of claim 1, wherein the audio body further comprises:
    a filter design analysis (FDA) chip for digital signal processing and signal amplification;
    a microcomputer (Micom) mounted onto a separate printed circuit board connected to the printed circuit board; and
    one or more speakers that output audio.

* * * * *